United States Patent
Endres et al.

(10) Patent No.: US 11,892,526 B2
(45) Date of Patent: Feb. 6, 2024

(54) MAGNETORESISTIVE SENSOR AND FABRICATION METHOD FOR A MAGNETORESISTIVE SENSOR

(71) Applicant: Infineon Technologies AG, Neubiberg (DE)

(72) Inventors: Bernhard Endres, Nabburg (DE); Klemens Pruegl, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 225 days.

(21) Appl. No.: 17/324,446

(22) Filed: May 19, 2021

(65) Prior Publication Data
US 2021/0373094 A1 Dec. 2, 2021

(30) Foreign Application Priority Data
May 29, 2020 (DE) .......................... 102020114551.9

(51) Int. Cl.
*G01R 33/09* (2006.01)
*H10N 50/01* (2023.01)
(Continued)

(52) U.S. Cl.
CPC ......... *G01R 33/093* (2013.01); *G01R 33/098* (2013.01); *H01F 10/3263* (2013.01);
(Continued)

(58) Field of Classification Search
None
See application file for complete search history.

(56) References Cited

U.S. PATENT DOCUMENTS 6,303,218 B1* 10/2001 Kamiguchi ......... H01F 10/3272
428/816
9,275,660 B1* 3/2016 Isowaki ............... G11B 5/3903
(Continued)

FOREIGN PATENT DOCUMENTS

| DE | 112010005566 B4 | 3/2013 |
| DE | 112015000975 T5 | 12/2016 |
| DE | 102019124033 A1 | 3/2020 |

OTHER PUBLICATIONS

Chongthanaphisut et al. (Scientific Reports, 2019, 9:4740). (Year: 2019).*

*Primary Examiner* — Kevin M Bernatz
(74) *Attorney, Agent, or Firm* — Harrity & Harrity, LLP (57) ABSTRACT

Exemplary embodiments are directed to magnetoresistive sensors and corresponding fabrication methods for magnetoresistive sensors. One example of a magnetoresistive sensor includes a layer stack, wherein the layer stack includes a reference layer having a fixed reference magnetization, wherein the fixed reference magnetization has a first magnetic orientation. The layer stack furthermore includes a magnetically free system of a plurality of layers, wherein the magnetically free system has a magnetically free magnetization, wherein the magnetically free magnetization is variable in the presence of an external magnetic field, and wherein the magnetically free magnetization has a second magnetic orientation in a ground state. The magnetically free system has two ferromagnetic layers and an interlayer, wherein the interlayer is arranged between the two ferromagnetic layers and includes magnesium oxide. The layer stack furthermore includes a barrier layer, which is arranged between the reference layer and the magnetically free system and includes magnesium oxide.

20 Claims, 9 Drawing Sheets

(51) Int. Cl.
    *H10N 50/10*        (2023.01)
    *H10N 50/80*        (2023.01)
    *H10N 50/85*        (2023.01)
    *H01F 10/32*        (2006.01)
    *H01F 41/30*        (2006.01)
    *G01R 33/00*       (2006.01)

(52) U.S. Cl.
    CPC ....... *H01F 10/3272* (2013.01); *H01F 41/307* (2013.01); *H10N 50/01* (2023.02); *H10N 50/10* (2023.02); *H10N 50/80* (2023.02); *H10N 50/85* (2023.02); *G01R 33/0052* (2013.01); *Y10T 428/1114* (2015.01)

(56) References Cited

U.S. PATENT DOCUMENTS

| | | | |
|---|---|---|---|
| 9,506,997 B2 | 11/2016 | Suzuki et al. | |
| 9,753,100 B2 | 9/2017 | Yano et al. | |
| 9,865,801 B1* | 1/2018 | Yamane | H10N 50/01 |
| 10,797,225 B2 | 10/2020 | Sundar et al. | |
| 2013/0175644 A1* | 7/2013 | Horng | B82Y 40/00 |
| | | | 257/E29.323 |
| 2014/0015078 A1* | 1/2014 | Huai | G11C 11/161 |
| | | | 257/421 |
| 2014/0175582 A1* | 6/2014 | Apalkov | G11C 11/161 |
| | | | 257/425 |
| 2015/0185297 A1 | 7/2015 | Zimmer et al. | |
| 2015/0200357 A1* | 7/2015 | Krounbi | H10N 50/80 |
| | | | 257/421 |
| 2015/0325623 A1* | 11/2015 | Chepulskyy | H10N 50/80 |
| | | | 257/421 |
| 2016/0197265 A1* | 7/2016 | Tang | G11C 11/1675 |
| | | | 257/421 |
| 2020/0403143 A1* | 12/2020 | Iwata | H10N 50/10 |
| 2021/0096195 A1* | 4/2021 | Muehlenhoff | G01R 33/098 |
| 2021/0104344 A1* | 4/2021 | Nguyen | H01F 10/3286 |
| 2021/0210677 A1* | 7/2021 | Prasad | H01F 10/3286 |
| 2022/0392505 A1* | 12/2022 | Stewart | H01F 10/3254 |

* cited by examiner

MAGNETORESISTIVE SENSOR AND FABRICATION METHOD FOR A MAGNETORESISTIVE SENSOR

RELATED APPLICATION

This application claims priority to German Patent Application No. 102020114551.9, filed on May 29, 2020, which is incorporated herein by reference in its entirety.

FIELD

Exemplary embodiments are concerned with magnetoresistive sensors and with corresponding fabrication methods for magnetoresistive sensors.

BACKGROUND

Magnetic field sensors based on the magnetoresistance effect, so-called magnetoresistive sensors, are often used. On account of their high signal level and their high accuracy and also the possibility of integrating them modularly in BICMOS or CMOS technologies, they are often the preferred choice vis-à-vis Hall-based magnetic field sensors. In this case, the group of magnetoresistive sensors comprises AMR, GMR or TMR sensors, for instance. The large number of different magnetoresistive effects is usually abbreviated to xMR, where the "x" serves as a placeholder for the different magnetoresistive effects. xMR sensors can detect the orientation of an applied magnetic field by measuring sine and cosine angle components using monolithically integrated magnetoresistive sensor elements. Here the acronym respectively denotes the magnetoresistive effect used for measuring the respective magnetic field. In this regard, GMR, for instance, stands for Giant MagnetoResistance (GMR), a quantum mechanical magnetoresistance effect that is observed in thin-film structures consisting of alternately ferromagnetic and nonmagnetic conductive layers. TMR stands for Tunnel MagnetoResistance (TMR), which is a magnetoresistive effect that occurs in a magnetic tunnel junction (MTJ), wherein the junction occurs at a thin insulator that separates two ferromagnets from one another. The acronym AMR stands for Anisotropic MagnetoResistance, which is a property of a material in which a dependence of the electrical resistance on the angle between the direction of the electric current (i.e. scanning axis) and the magnetization direction is observed.

There are various target variables in the design of magnetoresistive sensors. Firstly, one target may be to increase the magnetoresistive effect in order thus to increase the sensitivity of the sensor. Furthermore, one target may be to increase a linear range of the sensor. In some cases, the magnetoresistive effect may also be used to implement so-called angle sensors. In this case, one target may be to improve the angle error.

SUMMARY

One example is concerned with a magnetoresistive sensor having a layer stack. The layer stack includes a reference layer having a fixed reference magnetization. The reference magnetization has a first magnetic orientation. The layer stack furthermore includes a magnetically free system of a plurality of layers. The magnetically free system has a magnetically free magnetization. The magnetically free magnetization is variable in the presence of an external magnetic field. The magnetically free magnetization has a second magnetic orientation in a ground state. The magnetically free system has two ferromagnetic layers and an interlayer. The interlayer is arranged between the two ferromagnetic layers and includes magnesium oxide. The layer stack furthermore includes a barrier layer. The barrier layer is arranged between the reference layer and the magnetically free system and includes magnesium oxide.

A further example is concerned with a fabrication method for a magnetoresistive sensor. The method includes fabricating a layer stack of the magnetoresistive sensor by forming a reference layer having a fixed reference magnetization. The reference magnetization has a first magnetic orientation. Fabricating the layer stack furthermore includes forming a magnetically free system of a plurality of layers. The magnetically free magnetization is variable in the presence of an external magnetic field. The magnetically free magnetization has a second magnetic orientation in a ground state. The magnetically free system has two ferromagnetic layers and an interlayer. The interlayer is arranged between the two ferromagnetic layers and includes magnesium oxide. Fabricating the layer stack furthermore includes forming a barrier layer. The barrier layer is arranged between the reference layer and the magnetically free system and includes magnesium oxide.

BRIEF DESCRIPTION OF THE DRAWINGS

Some examples of devices and/or methods are explained in greater detail merely by way of example below with reference to the accompanying figures, in which.

DETAILED DESCRIPTION

Various examples will now be described more thoroughly with reference to the accompanying figures, in which some examples are illustrated. In the figures, the thicknesses of lines, layers and/or regions may be exaggerated for elucidation purposes.

While further examples are suitable for various modifications and alternative forms, some specific examples thereof are accordingly shown in the figures and are described thoroughly below. However, this detailed description does not restrict further examples to the specific forms described. Further examples can cover all modifications, counterparts and alternatives that fall within the scope of the disclosure. Throughout the description of the figures, identical or similar reference signs refer to identical or similar elements which can be implemented identically or in modified form in a comparison with one another, while they provide the same or a similar function.

It goes without saying that if one element is designated as "connected" or "coupled" to another element, the elements can be connected or coupled directly or via one or more intermediate elements. If two elements A and B are combined using an "or", this should be understood such that all possible combinations are disclosed, i.e. only A, only B, and A and B, unless explicitly or implicitly defined otherwise. An alternative wording for the same combinations is "at least one of A and B" or "A and/or B". The same applies, mutatis mutandis, to combinations of more than two elements.

The terminology used here to describe specific examples is intended to be non-limiting for further examples. If a singular form, e.g. "a, an" and "the", is used and the use of only a single element is defined neither explicitly nor implicitly as obligatory, further examples can also use plural elements in order to implement the same function. If a function is described below as being implemented using a plurality of elements, further examples can implement the same function using a single element or a single processing entity. Furthermore, it goes without saying that the terms "comprises", "comprising", "has" and/or "having" in their usage indicate with greater precision the presence of the specified features, integers, steps, operations, processes, elements, components and/or a group thereof, but do not exclude the presence or the addition of one or more other features, integers, steps, operations, processes, elements, components and/or a group thereof.

Unless defined otherwise, all terms (including technical and scientific terms) are used here in their customary meaning in the field with which examples are associated.

FIGS. 1a to 1d show schematic diagrams of exemplary embodiments of a layer stack (100a-100d) for a magnetoresistive sensor. FIGS. 1a to 1d additionally show a corresponding magnetoresistive sensor having such a layer stack. Said layer stack has the following construction in common. The layer stack comprises a reference layer 10 having a fixed reference magnetization. The reference magnetization has a first magnetic orientation. The layer stack furthermore comprises a barrier layer 20 comprising magnesium oxide. The layer stack furthermore comprises a magnetically free system 30 of a plurality of layers. The magnetically free system has a magnetically free magnetization. The magnetically free magnetization is variable in the presence of an external magnetic field. The magnetically free magnetization has a second magnetic orientation in a ground state. The magnetically free system has two ferromagnetic layers 32; 38 and (at least) one interlayer 34; 36. The interlayer is arranged between the two ferromagnetic layers. The interlayer comprises magnesium oxide. The barrier layer is arranged between the reference layer and the magnetically free system.

Exemplary embodiments of the present disclosure are concerned with magnetoresistive sensors and with layer stacks for magnetoresistive sensors. Magnetoresistive sensors are magnetic field sensors whose functioning is based on a resistance being altered by an (external) magnetic field. Said resistance can then be determined with the aid of a sensor circuit (for instance based on a voltage drop across the resistance) and be used to make statements about the magnetic field.

Figure 1A:
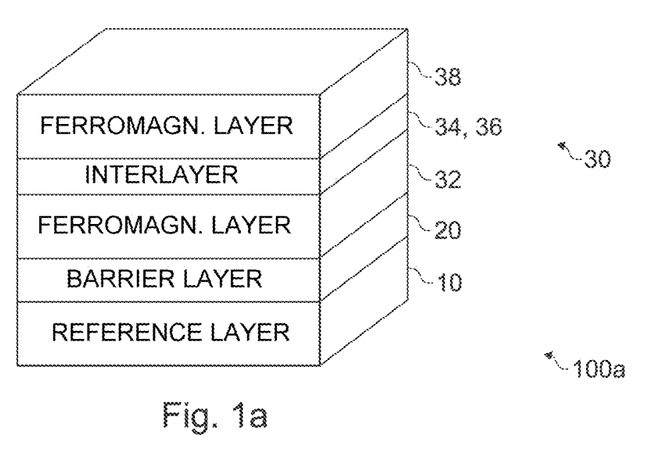
FIGS. 1a to 1d show schematic diagrams of exemplary embodiments of a layer stack for a magnetoresistive sensor.
Figure 1B:
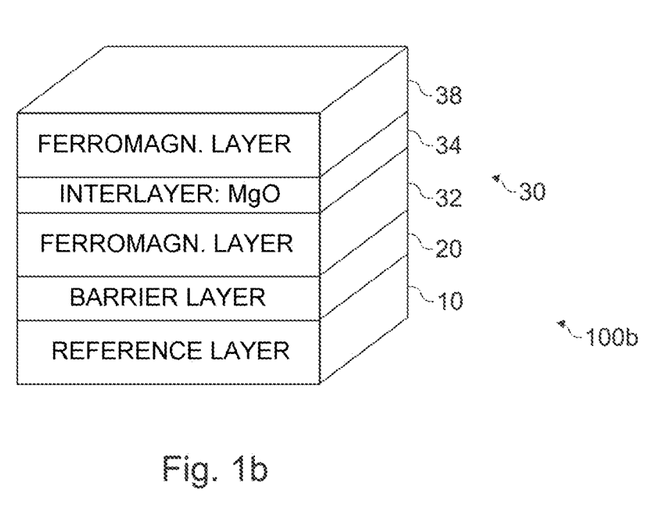
Figure 1C:
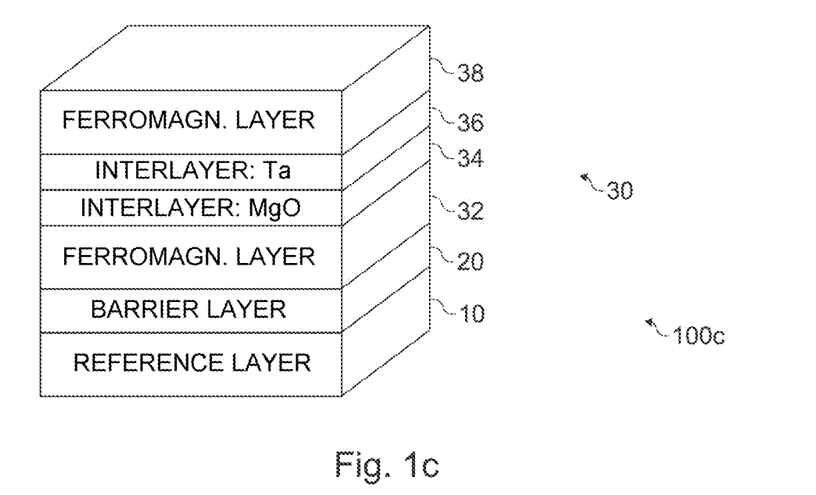
Figure 1D:
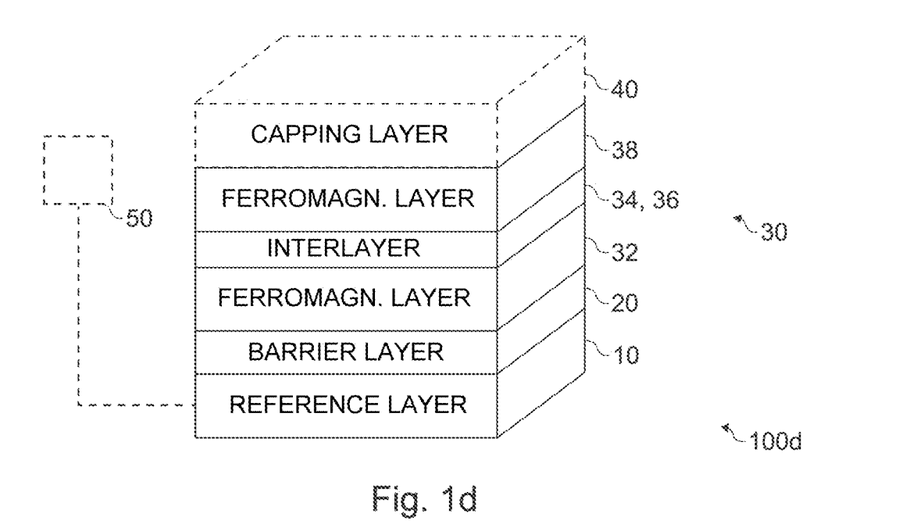

In at least some exemplary embodiments, the magnetoresistive sensor can thus comprise a sensor circuit 50, as is shown in FIG. 1d, for instance. A magnetic field sensor includes one or more sensor elements, for example, which can be configured to measure one or more properties of a magnetic field (for instance one or more elements from the group of a magnetic field flux density, a field strength, a field angle, a field direction, a field orientation, etc.). In other words, the sensor circuit 50 can comprise one or more sensor elements which can be configured to measure one or more properties of a magnetic field. The magnetic field can be generated by a magnet, a current-carrying conductor (e.g. a wire), the earth or some other magnetic field source. Each sensor element can be configured for example to generate a sensor signal (e.g. a voltage signal) as a reaction to one or more magnetic fields impinging on the sensor element. Consequently, a sensor signal is an indicator of the size and/or the orientation of the magnetic field impinging on the sensor element. The one or more sensor elements can be configured to detect one or more direction components of an external magnetic field across the layer stack in order to generate one or more voltages corresponding to the one or more direction components of the external magnetic field.

Exemplary embodiments of the present disclosure are generally concerned with improving magnetoresistive sensors, in particular TMR sensors, for instance by increasing the perpendicular magnetic anisotropy and the TMR effect by interlayer exchange coupling by way of magnesium oxide (MgO). Consequently, the sensor can be based on a tunnel magnetoresistance, TMR, effect. In this case, two types of (TMR-based) magnetoresistive sensors are taken as subjects hereinafter, linear sensors and angle sensors.

The layer stack comprises the reference layer 10, which has a fixed reference magnetization having the first magnetic orientation. In this case, "fixed" means here that the reference magnetization does not change or changes only insignificantly under the influence of an external magnetic field. In this case, in some exemplary embodiments, the first magnetic orientation can be oriented in-plane. However, implementations in which the first magnetic orientation is oriented perpendicular to the plane (out-of-plane) are also conceivable. In at least some exemplary embodiments, the reference layer comprises a cobalt-iron-boron alloy or is composed of a cobalt-iron-boron alloy. In this case, the reference layer can be part of a reference system, as is shown in FIGS. 3b to 5c, for instance.

In this case, in-plane means that the magnetic orientation of the layer extends along a largest (lateral) extension of the layers (for instance of the reference layer) of the layer stack. In other words, a plane is spanned along the largest extent of the individual layers of the layer stack. If the magnetization of said layer extends along said plane, then the layer has an "in-plane magnetization" or, in other words, an in-plane anisotropy or an anisotropy within the plane. The contrast to this is an out-of-plane magnetization. If the magnetization of the layer extends perpendicular to the plane, then the layer has an "out-of-plane magnetization" or, in other words, an out-of-plane anisotropy or an anisotropy perpendicular to the plane. In this case, the plane defines an x- and a y-direction component. A z-direction component extends perpendicular to the plane. Hereinafter a lateral direction or extent and a vertical direction or extent are also defined relative to the plane. In this case, the lateral direction extends parallel to the x/y-direction component, and the vertical direction extends parallel to the z-direction component. In all cases it is assumed that the layers of the layer stack are arranged vertically with respect to one another or are vertically adjacent.

The layer stack furthermore comprises the barrier layer 20. In this case, the barrier layer can be a tunnel barrier layer, for instance, such as is used for producing the TMR effect. The barrier layer 20 comprises magnesium oxide. By way of example, the barrier layer can be fabricated from magnesium oxide. The barrier layer is arranged between the reference layer 10 and the magnetically free system 30. By way of example, the barrier layer can be in contact with the reference layer and/or a layer of the magnetically free system (for instance with the ferromagnetic layer 32). In other words, the barrier layer can be arranged directly adjacent to the reference layer and a layer of the magnetically free system (for instance with the ferromagnetic layer 32).

The layer stack furthermore comprises the magnetically free system 30. In this case, the magnetically free system comprises a plurality of layers (32-38), which act in combination as a magnetically free layer. In other words, the magnetically free system can act as a magnetically free layer, but comprise a plurality of layers. The magnetically free system has a magnetically free magnetization, wherein the magnetically free magnetization is variable in the presence of an external magnetic field. Therefore, the magnetically free system, or the magnetically free layer is also called a sensor layer, since the changes in the magnetization are used to determine the desired target variable. The magnetically free magnetization has the second magnetic orientation in a ground state. In this case, the ground state is a state in which an influence of an external magnetic field on the magnetically free layer is absent or negligibly small.

Hereinafter a distinction is drawn between two types of magnetoresistive sensors, namely between linear sensors and angle sensors. The layer stack presented above can be used in both types of sensors. However, both types of sensors have specific requirements, for instance with regard to the magnetic orientation of the reference layer and/or of the magnetically free system. What the layer stacks for both types of sensors have in common, however, is that they have two ferromagnetic layers 32; 38 and at least one interlayer 34; 36, wherein the interlayer is arranged between the two ferromagnetic layers and comprises magnesium oxide.

A first type of the magnetoresistive sensor is a so-called linear sensor. In other words, the magnetoresistive sensor can be a linear sensor. In this case, a linear sensor can be for example a sensor configured to determine a linear movement or a linear position. Furthermore, linear sensors can be used to measure a magnetic field or an electric current with a high accuracy. Consequently, the one or more voltages generated by the sensor circuit can be indicative of the linear position or the linear movement, of the magnetic field or of the electric current. In the case of such a linear sensor based on the TMR effect, it is possible to use TMR junctions with a magnetically free layer (sensor layer) which exhibits a linear change in resistance when the magnetic field changes. In order to be able to measure in a wide field range, it is possible to use a very thin sensor layer in which the magnetization points out-of-plane on account of an interface effect between the MgO tunnel barrier and the cobalt-iron-boron (CoFeB) used as sensor layer. In other words, the second magnetic orientation can be oriented out-of-plane. Furthermore, the first magnetic orientation can be oriented in-plane. On account of this interface effect, very thin sensor layers are often preferred, which also results in a very small TMR effect or a very low sensitivity.

In order to achieve larger TMR effects, it can be advantageous to use a thicker sensor layer, as a result of which the measurement range is reduced. In order to increase both, the magnetic anisotropy out-of-plane (PMA, Perpendicular Magnetic Anisotropy) can be increased by the use of the MgO interlayer of the magnetically free system. By means of the additional interlayer, the PMA effect that arises at the interface between CoFeB and magnesium oxide can be brought about at a greater number of interfaces. This makes it possible to use thicker ferromagnetic layers within the magnetically free system, as a result of which in turn a larger TMR effect can be achieved.

The magnetically free system of the linear sensor can thus comprise two ferromagnetic layers, which are fabricated from cobalt-iron-boron, for example, and which are in contact with a (single) interlayer 34 fabricated from magnesium oxide. In other words, the two ferromagnetic layers can be fabricated from a cobalt-iron-boron alloy. The interlayer 34 can be fabricated from magnesium oxide. Furthermore, the interlayer 34 can be in contact with the two ferromagnetic layers. Accordingly, in this case, the magnetically free system can comprise a single interlayer, for example. In at least some exemplary embodiments, the magnetically free system can consist of the two ferromagnetic layers 32; 38 and the (single) interlayer 34. A layer stack having such a system is shown for example in FIG. 1b.

In this case, the additional MgO interlayer within the sensor layer (that is to say the magnetically free system) is used to increase the PMA effect. By way of the additional MgO interfaces, the magnetic anisotropy is increased, such that thicker sensor layers can be used. This increases the TMR effect and thus improves the sensitivity of the sensor. The additional MgO layer can have a predefined thickness in order that the sensor layer couples ferromagnetically via this interlayer.

The concept can be used for the sensor layer of a TMR junction in the following way. The additional MgO interlayer couples the adjacent CoFeB layers by way of an interlayer exchange coupling (IEC) effect, such that they behave like a single sensor layer with increased anisotropy out-of-plane. As a result, a thicker CoFeB layer can be used, which increases the TMR effect and thus the sensitivity of the sensor. At least some exemplary embodiments of the present disclosure are thus based on a combination of interlayer exchange coupling (IEC) with magnetic anisotropy. It is thereby possible to obtain improvements in sensor performance and production.

A further type of sensor that can be improved by a magnesium oxide interlayer is a magnetoresistive angle sensor. In other words, the magnetoresistive sensor can be an angle sensor. Angle sensors are configured to identify an orientation of an external magnetic field in order, on the basis thereof, to determine for example an angle of two components with respect to one another. Consequently, the one or more voltages generated by the sensor circuit can be indicative of the orientation of the magnetic field. In this case, for example, a resistance-based measurement of sine and cosine angles can be carried out by way of one or more layer stacks of the sensor (by the sensor circuit). In angle sensors, the magnesium oxide interlayer, for instance in conjunction with a tantalum interlayer, can be used to ensure a small angle error, on the one hand, and to increase a TMR effect, on the other hand.

A magnetically free system having two ferromagnetic layers and interlayers composed of ruthenium and tantalum is used in some layer stacks for angle sensors. In this case, tantalum as interlayer creates a magnetic "dead" layer (MDL) and reduces the TMR effect, while ruthenium results in a larger angle error. By using magnesium oxide instead of ruthenium and tantalum, it is possible to prevent the formation of a magnetic dead layer; moreover, a small angle error is achieved. In other words, it is possible to use a layer stack having a magnetically free system with an interlayer comprising magnesium oxide. In this case, it has been shown experimentally that, in order to increase the TMR by comparison with an individual magnesium oxide interlayer, a combination of a magnesium oxide interlayer with a tantalum interlayer can achieve a larger TMR effect.

The interlayer can thus comprise a first interlayer 34 and a second interlayer 36. In other words, the magnetically free system 30 can comprise a first interlayer 34 and a second interlayer 36. Both interlayers are arranged between the two ferromagnetic layers 32; 38. In this case, the first interlayer can be fabricated from magnesium oxide, and the second interlayer can be fabricated from tantalum. The tantalum interlayer can be arranged on the magnesium oxide interlayer. In other words, the second interlayer can be further away from the barrier layer than the first interlayer. In this case, the magnetically free system can comprise exactly two interlayers, for example. Consequently, the first interlayer and the second interlayer can each be in contact with one of the two ferromagnetic layers. The first interlayer can be in contact with the first ferromagnetic layer (which in turn is in contact with the barrier layer), and the second interlayer can be in contact with the second ferromagnetic layer (which in turn, optionally, is in contact with a capping layer 40). In a layer stack for an angle sensor, both the first magnetic orientation and the second magnetic orientation can be oriented in-plane.

Both in layer stacks for linear sensors and in layer stacks for angle sensors, the interlayer can have a minimum and/or maximum thickness. By way of example, the interlayer 34; 36 can have a thickness of at least 0.05 nm (or at least 0.1 nm, or at least 0.2 nm) and/or at most 0.7 nm (or at most 0.6 nm, or at most 0.5 nm, or at most 0.4 nm). By way of example, an interlayer exchange coupling effect can be achievable in the case of interlayer thicknesses of (at least) up to 0.4 nm. In the case of linear sensors, good results could be achieved with a layer thickness of 0.3 nm for the magnesium oxide interlayer. In the case of angle sensors, good results were achieved with a magnesium oxide interlayer having a thickness of 0.1 nm and a tantalum interlayer having a thickness of 0.2 nm (with a thickness of the interlayer of 0.3 nm).

The thickness and the material of the two ferromagnetic layers also influence the sensor properties of the respective magnetoresistive sensor. By way of example, at least one of the two ferromagnetic layers can be fabricated from a cobalt-iron-boron alloy. Hereinafter that one of the two ferromagnetic layers which is arranged nearer to the barrier layer (that is to say for instance is in contact with the barrier layer) is referred to as first ferromagnetic layer, and the other of the two ferromagnetic layers (which is arranged further away from the barrier layer) is referred to as second ferromagnetic layer. In some exemplary embodiments, both ferromagnetic layers can be fabricated from a cobalt-iron-boron alloy, for instance in a layer stack for a linear sensor. Alternatively, just the first ferromagnetic layer (that is to say the ferromagnetic layer arranged adjacent to the barrier layer) can be fabricated from a cobalt-iron-boron alloy, for instance in a layer stack for an angle sensor. In these cases, the second ferromagnetic layer (that is to say that one of the two ferromagnetic layers which is arranged further away from the barrier layer) can be a soft-magnetic material. Soft-magnetic generally denotes materials which can easily be magnetized in an external magnetic field. The hysteresis loss during magnetization is kept small in this case. One such soft-magnetic material is a nickel-iron alloy, for example. By way of example, that one 38 of the two ferromagnetic layers which is (arranged) further away from the barrier layer (that is to say the second ferromagnetic layer) than the other of the two ferromagnetic layers can be fabricated from a nickel-iron alloy.

The thickness of the ferromagnetic layers can also have an influence. In this regard, for example, the first ferromagnetic layer can have a thickness of at least 0.5 nm and/or at most 2 nm. The second ferromagnetic layer can have a thickness of at least 0.2 nm.

In at least some exemplary embodiments, the layer stack furthermore comprises a capping layer 40. The capping layer 40 can be arranged for example adjacent to the magnetically free system, that is to say can be in contact with the second ferromagnetic layer, for example. In this case, the capping layer can comprise magnesium oxide. By way of example, the capping layer can comprise a plurality of layers, and one of the layers can be fabricated from magnesium oxide.

The manner of functioning is explained below based on exemplary embodiments. The use of a magnetically free system having a magnesium oxide interlayer (and, optionally, a tantalum interlayer) can, depending on the type of sensor, improve various properties of the respective sensor. In the case of angle sensors, an angle error and a TMR effect can be improved with such an interlayer (or interlayers). Tantalum as interlayer creates magnetic "dead" layers (MDLs) in the measurement layer (of the magnetically free layer/magnetically free system) and reduces the TMR effect. Ruthenium as interlayer results in a larger angle error. If a magnesium oxide (MgO) capping is used, then no MDL is created. The TMR effect and the angle error can be improved by means of an interlayer comprising a tantalum layer (for example 0.2 nm) and a magnesium oxide layer (for example 0.1 nm).

Figure 2A:
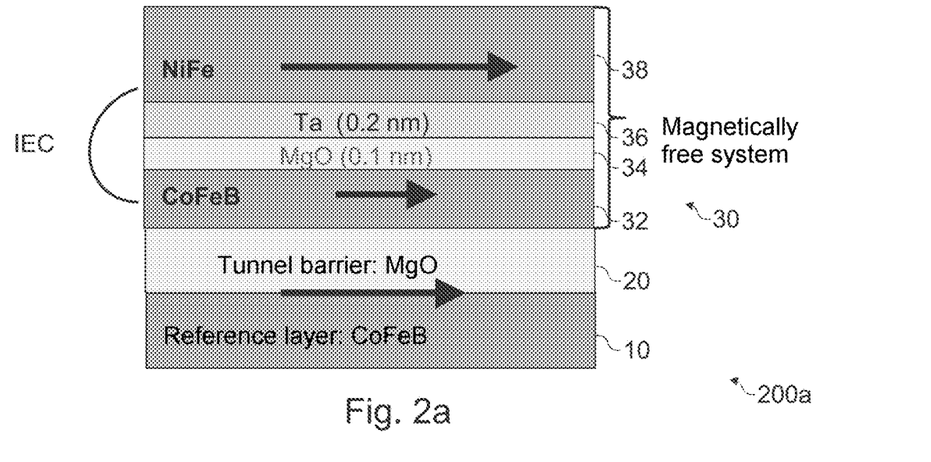
FIG. 2a shows a schematic diagram of an exemplary embodiment of a layer stack for an angle sensor.

FIG. 2a shows a schematic diagram of an exemplary embodiment of a layer stack for an angle sensor. The layer stack comprises a reference layer 10 (composed of cobalt-iron-boron, CoFeB), thereabove a tunnel barrier layer 20 (composed of magnesium, MgO), thereabove a magnetically free layer system 30 having two ferromagnetic layers 32; 38 (cobalt-iron-boron and nickel-iron) and two interlayers 34; 36 (magnesium oxide and tantalum). In this case, the magnetic orientation of the reference layer and of the two ferromagnetic layers of the magnetically free layer system (in the quiescent state) is oriented in-plane.

Figure 2B:
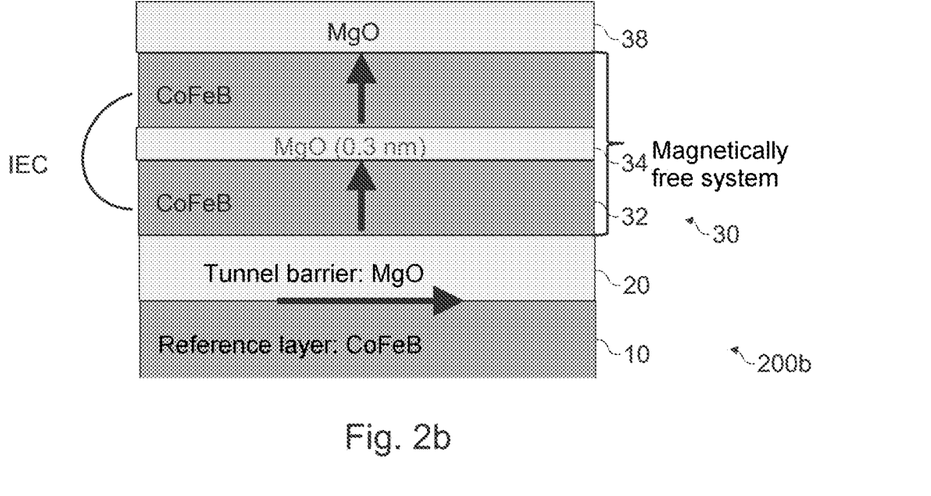
FIG. 2b shows a schematic diagram of an exemplary embodiment of a layer stack for a linear sensor.

In linear sensors, the concept presented can be used to improve the linear range and/or the TMR effect. Perpendicular magnetic anisotropy (PMA) is produced at the interface between cobalt-iron-boron and magnesium oxide. As a result, without an interlayer, however, only thin measurement layers become possible, with a small TMR effect. By means of a magnesium oxide interlayer (having a thickness of 0.3 nm, for example), the PMA effect (that is to say the linear range, for example) and the TMR effect (that is to say the sensitivity, for example) can be improved by the magnesium oxide interlayer. FIG. 2b shows a schematic diagram of an exemplary embodiment of a layer stack for a linear sensor. The layer stack comprises a reference layer 10 (composed of cobalt-iron-boron, CoFeB), a tunnel barrier layer 20 (composed of magnesium oxide, MgO), a magnetically free layer system 30 having two cobalt-iron-boron layers 32; 38 and a magnesium oxide interlayer 34, and also a magnesium oxide capping layer 40. In this case, the magnetic orientation of the reference layer 10 is oriented in-plane, and the magnetic orientation of the two CoFeB layers 32; 38 of the magnetically free layer system in the ground state is oriented out-of-plane.

More details and aspects of the magnetoresistive sensor and/or of the layer stack are mentioned in connection with the concept or examples described above (e.g. FIGS. 1a to 1d). The magnetoresistive sensor and/or the layer stack can comprise one or more additional optional features corresponding to one or more aspects of the proposed concept or of the described examples, as have been described above or below.

Figure 3A:
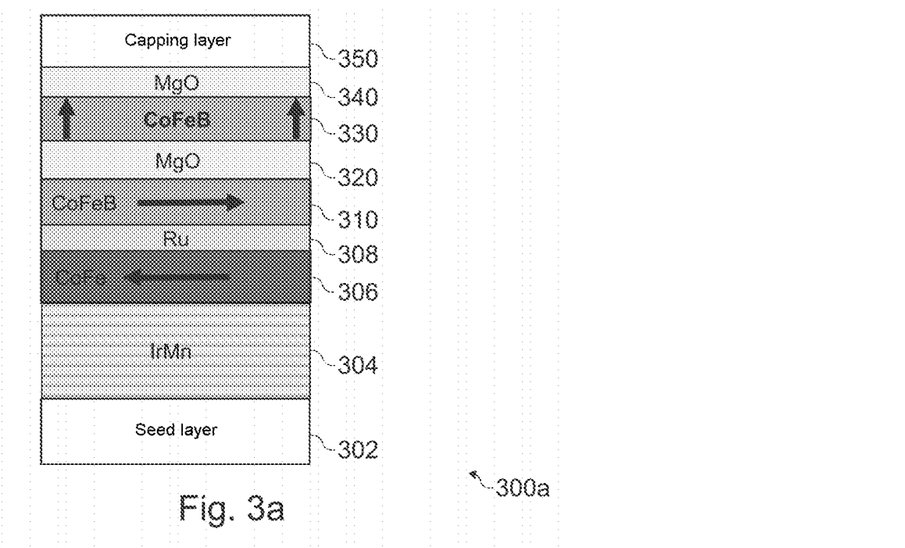
FIG. 3a shows a schematic diagram of an example of a layer stack for a linear sensor.

In a PMA linear sensor, a double magnesium oxide barrier is used in other systems. This gives rise to no magnetic dead layers with the use of a magnesium oxide capping, and to a fifty-percent increase in the PMA effect with the magnesium oxide capping. However, a very thin magnetically free layer of <1 nm is still necessary, with a small TMR effect. FIG. 3a shows a schematic diagram of an example of a layer stack for a linear sensor. Exemplary thicknesses for the individual layers of the respective layer stack are indicated in the following figures. In this case, however, the disclosure is not restricted to the layer thicknesses indicated; the latter are presented merely as an illustrative example. The layer stack comprises an iridium-manganese layer 304 (IrMn, having a thickness of 10 nm), a reference layer system having a cobalt-iron layer 306 ($Co_{70}Fe_{30}$, having a thickness of 1.8 nm), a ruthenium layer 308 (Ru, having a thickness of 0.725 nm), and a cobalt-iron-boron layer (CoFeB) 310. The layer stack furthermore comprises a magnesium oxide tunnel barrier layer 320, a free magnetic layer 330 composed of cobalt-iron-boron, and a magnesium oxide capping layer 340. A tantalum nitride (TaN, 20 nm) layer and a ruthenium (Ru, 5 nm) layer 350 can furthermore be arranged above the magnesium oxide capping layer. Various other (seed) layers (silicon oxide (SiOx)|, tantalum (Ta, 5 nm) copper nitride (CuN, 20 nm), tantalum (Ta, 10 nm), ruthenium (Ru, 2 nm) and tantalum (Ta, 10 nm)) can be arranged below the iridium-manganese layer. In this case, the magnetic orientation of the magnetically free layer in the ground state is oriented out-of-plane, and the magnetic orientation of the reference system is oriented in-plane, wherein the magnetic orientation of the cobalt-iron-boron layer 310 is antiparallel to the magnetic orientation of the cobalt-iron layer 306.

Figure 3B:
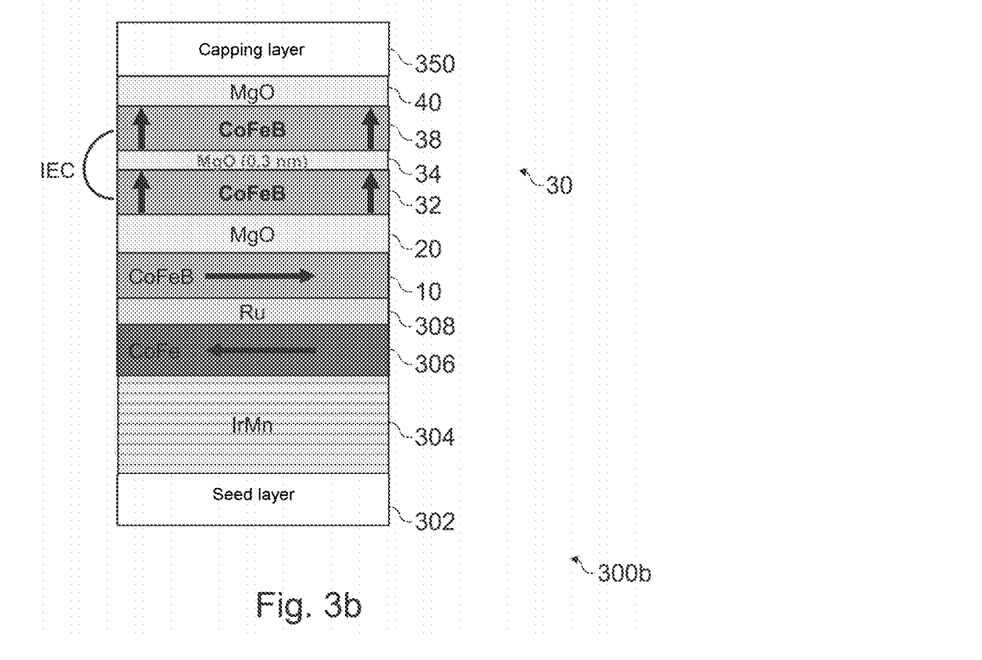
FIG. 3b shows a schematic diagram of an exemplary embodiment of a layer stack for a linear sensor.

In exemplary embodiments, by way of a triple magnesium oxide barrier (by way of the additional magnesium oxide interlayer), the PMA effect can be increased by way of the additional magnesium oxide interfaces. In this case, it is possible to produce interlayer exchange coupling (IEC) by way of the magnesium oxide. Consequently, a thicker magnetically free layer system or a larger linear range is made possible, and also a greater TMR effect/sensitivity. FIG. 3b shows a corresponding layer stack in which the magnetically free layer system comprises a magnesium oxide interlayer. FIG. 3b shows a schematic diagram of an exemplary embodiment of a layer stack for a linear sensor. The layer stack comprises, similarly to the layer stack in FIG. 3a, a seed layer 302, an iridium-manganese layer 304 and a reference layer system having a cobalt-iron layer 306, a ruthenium layer 308, and a cobalt-iron-boron layer 10, which can correspond to the reference layer 10 in FIGS. 1a to 2b. Furthermore, the layer stack comprises a tunnel barrier layer 20 composed of magnesium oxide, a magnetically free system having two cobalt-iron-boron layers 32; 38 and an interlayer 34 composed of magnesium oxide, and a capping layer composed of magnesium oxide. A tantalum nitride (TaN, 20 nm) layer and a ruthenium (Ru, 5 nm) layer 350 can furthermore be arranged above the magnesium oxide capping layer. In this case, the magnetic orientation of the magnetically free system in the ground state is oriented out-of-plane, and the magnetic orientation of the reference system is oriented in-plane.

Figure 4A:
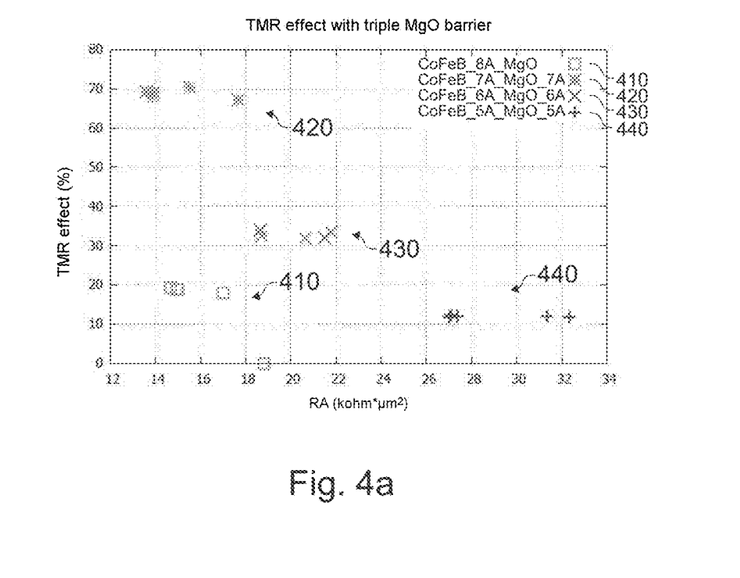
FIG. 4a shows a schematic diagram showing a barrier resistance and a TMR effect for various layer stacks.

FIG. 4a shows a schematic diagram showing a barrier resistance and a TMR effect for various layer stacks. FIG. 4a shows a diagram in which the barrier resistance (kohm*$\mu m^2$, x-axis) and the TMR effect (in %) are plotted. With an additional magnesium oxide interlayer, an increased barrier resistance can be ascertained here. The TMR effect is greatly dependent on the thickness of the magnetically free layer. Four different implementations of a layer stack 410-440 are compared here. FIG. 4a 410 shows the values for a layer stack having CoFeB (0.8 nm)/MgO (0.5 nm) TaN without an interlayer, FIG. 4a 420 shows the values for a layer stack having CoFeB (0.7 nm), MgO (0.3 nm), CoFeB (0.7 nm), FIG. 4a 430 shows the values for a layer stack having CoFeB (0.6 nm)/MgO (0.3 nm)/CoFeB (0.6 nm), and FIG. 4a 440 shows the values for a layer stack having CoFeB (0.5 nm)/MgO (0.3 nm)/CoFeB (0.5 nm). In this case, the TMR effect for the magnetically free layer with 0.8 nm (410) with a double magnesium oxide barrier lies between the TMR effect for the magnetically free layer of 0.5 nm (430) and 0.6 nm (440).

Figure 4B:
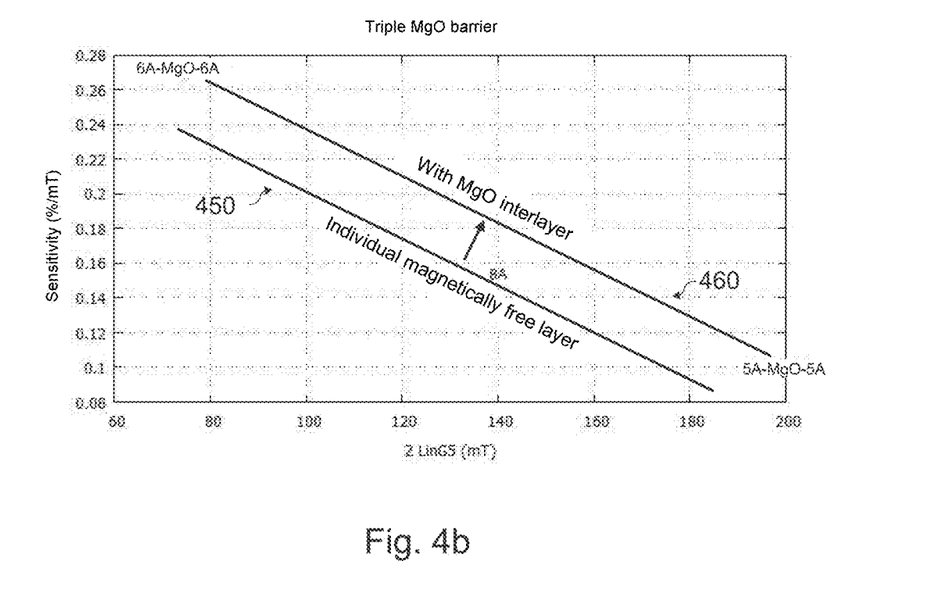
FIG. 4b shows a schematic diagram showing a sensitivity and a linear range for various layer stacks.

FIG. 4b shows a schematic diagram showing a sensitivity and a linear range for various layer stacks. In FIG. 4b, the sensitivity (in %/mT) is plotted against the linear range (LinG, in mT) for a comparison with a triple versus a double magnesium oxide barrier. By reducing the thickness of the magnetically free layer, it is possible to increase the linear range (LinG) at the expense of the sensitivity. By using an additional magnesium oxide interlayer, both the sensitivity and the linear range can be increased and respectively enlarged. This can be seen in FIG. 4b, wherein FIG. 4b 450 shows a characteristic curve for a layer stack having a single magnetically free layer, and FIG. 4b 460 shows the characteristic curve for a magnetically free layer system having a magnesium oxide interlayer, wherein there the values are plotted between an example with 0.6 nm CoFeB layers with a magnesium oxide interlayer and an example with 0.5 nm CoFeB layers with a magnesium oxide interlayer. An increase in the sensitivity or the linear range of 10% can be made possible in this case. In FIG. 4b, the values are shown by way of example for a sensor having a linear range of 200 mT and a sensitivity of 0.1%/mT with a 0.5 nm/MgO/0.5 nm magnetically free layer system. It is shown that the magnesium oxide interlayer functions, and that magnetically free layers having a thickness of more than 1 nm are made possible.

More details and aspects of the magnetoresistive sensor and/or of the layer stack are mentioned in connection with the concept or examples described above (e.g. FIGS. 1a to 2b). The magnetoresistive sensor and/or the layer stack can comprise one or more additional optional features corresponding to one or more aspects of the proposed concept or of the described examples, as have been described above or below.

Figure 5A:
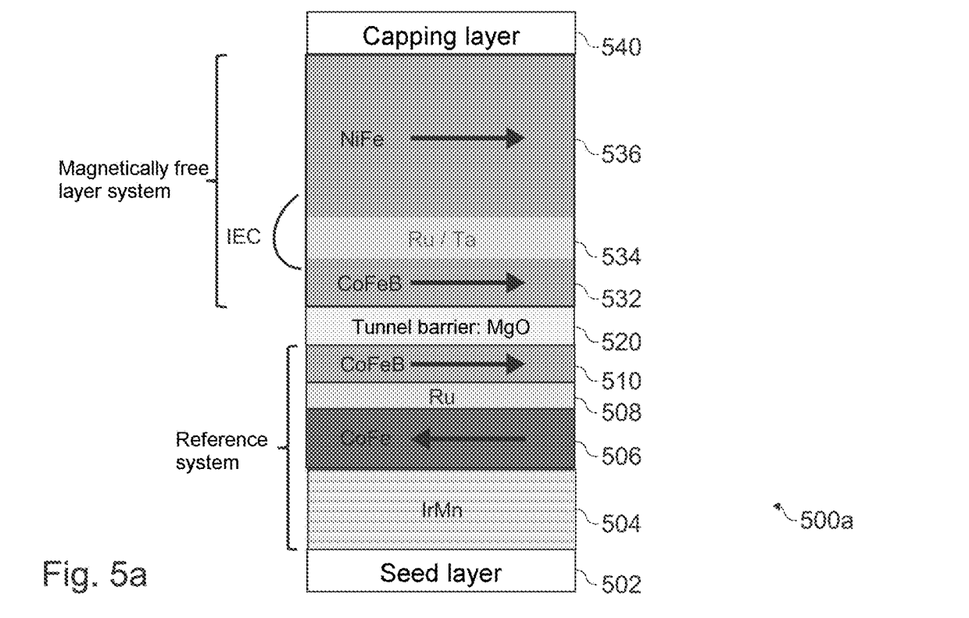
FIG. 5a shows a schematic diagram of an example of a layer stack for an angle sensor.

In angle sensors, in other systems of ruthenium or tantalum layers, magnetic dead layers are produced in the magnetically free layer system if said layers are used as interlayers. In this case, ruthenium as interlayer produces a larger angle error. FIG. 5a shows a schematic diagram of an example of a layer stack for an angle sensor. The layer stack comprises a reference system having an iridium-manganese layer 504 (IrMn, 10 nm), a cobalt-iron layer (CoFe) 506, a ruthenium layer 508 and a cobalt-iron-boron layer 510. That is followed by a tunnel barrier layer 520 composed of magnesium oxide, and a magnetically free layer system having a cobalt-iron-boron layer 532 ($Co_{60}Fe_{20}B_{20}$, 1.5 nm), a ruthenium (Ru, 1.2 nm) and/or tantalum (Ta, 0.2 nm) interlayer 534 and a nickel-iron layer 536 ($Ni_{80}Fe_{20}$, 10 nm). Interlayer exchange coupling takes place between the cobalt-iron-boron layer and the nickel-iron layer of the magnetically free layer system. In this case, the magnetic orientation of the reference system is oriented in-plane, also in the layer stacks in FIGS. 5b, 5c and 6a.

No magnetic dead layers are produced if magnesium oxide is used as capping layer or interlayer. The TMR effect and the angle error can possibly be improved with a magnesium oxide interlayer for interlayer exchange coupling.

Figure 5B:
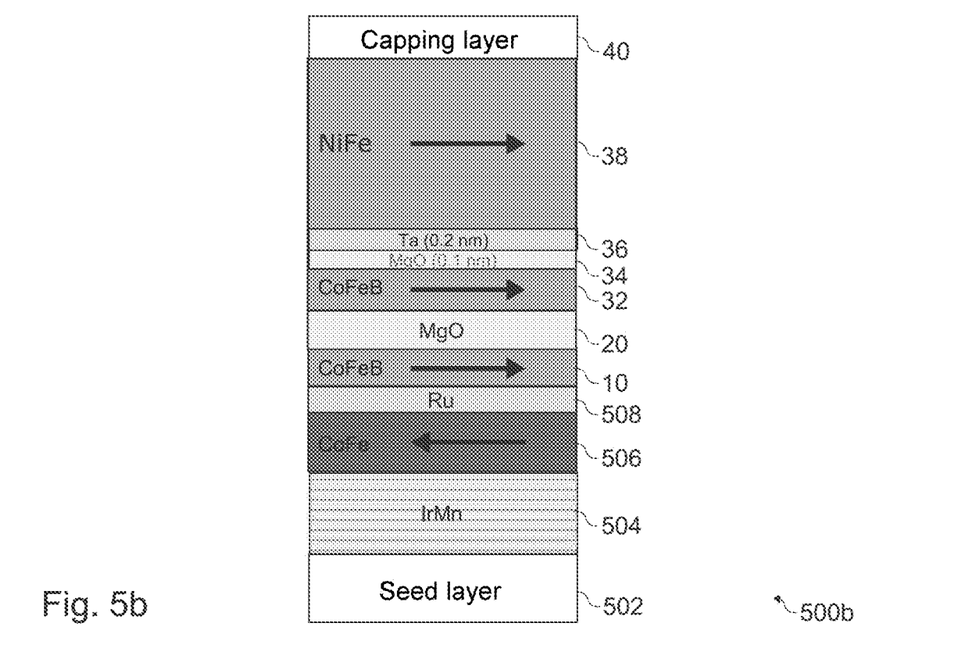
FIGS. 5b and 5c show schematic diagrams of exemplary embodiments of layer stacks for angle sensors.
Figure 5C:
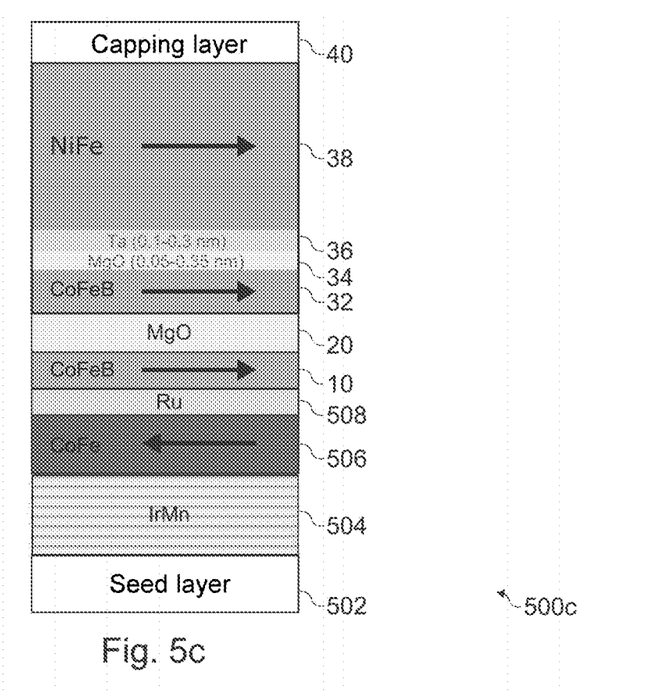

FIGS. 5b and 5c show schematic diagrams of exemplary embodiments of layer stacks for angle sensors. The layer stacks in FIGS. 5b and 5c comprise a seed layer system 502 having a plurality of layers (silicon oxide (SiOx)|tantalum (Ta, 5 nm), copper nitride (CuN, 20 nm), tantalum (Ta, 5 nm) ruthenium (Ru, 5 nm) and tantalum (Ta, 5 nm)). The layer stack furthermore comprises an antiferromagnetic (AFM) layer 504 composed of iridium-manganese (IrMn, 10 nm), a pinning layer (PL) 506 composed of a cobalt-iron alloy ($Co_{70}Fe_{30}$, 1.8 nm), a Ruderman-Kittel-Kasuya-Yosida (RKKY) coupling layer 508 composed of ruthenium (Ru, 0.725 nm), a reference layer (RL) 10 composed of cobalt-iron-boron ($Co_{60}Fe_{20}B_{20}$, 1.4 nm), a barrier layer (Barr) 20 composed of magnesium oxide (MgO, 0.1 to 1 nm), a magnetically free system having two ferromagnetic layers composed of cobalt-iron-boron 32 ($Co_{60}Fe_{20}B_{20}$, 1.5 nm) and nickel-iron 38 ($Ni_{80}Fe_{20}$, 10 nm), a first interlayer 34 composed of magnesium oxide and a second interlayer 36 composed of tantalum, and a tantalum nitride layer (TaN, 20 nm) and a ruthenium layer (Ru, 5 nm) 40. In this case, in FIG. 5b, the thickness of the first interlayer 34 is 0.1 nm and the thickness of the second interlayer 36 is 0.2 nm. In FIG. 5c, the thickness of the first interlayer 34 is between 0.05 nm and 0.35 nm, and the thickness of the second interlayer 36 is between 0.1 nm and 0.3 nm.

In this case, a small angle error was measured in the case of an interlayer with 0.3 nm magnesium oxide, and so good interlayer exchange coupling can be assumed. However, in some cases it is possible to observe a smaller TMR effect with a magnesium oxide interlayer (~80%). There, however, the nickel-iron crystallization can influence the crystal growth of the cobalt-iron-boron layer.

Figure 5D:
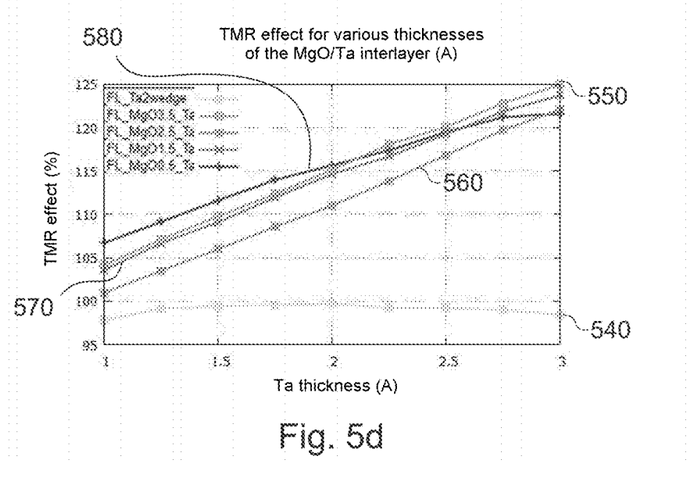
FIG. 5d shows a schematic diagram showing a TMR effect for various thicknesses of a magnesium oxide/tantalum interlayer.

Therefore, as is shown in FIGS. 5b and 5c, an exemplary embodiment of a layer stack comprising two interlayers fabricated from magnesium oxide and tantalum was implemented. In this case, in one exemplary embodiment, with a 0.2 nm magnesium oxide interlayer and a 0.2 nm tantalum interlayer a TMR effect of 113% was achieved (with a barrier resistance RA of 4.9), with a 0.1 nm magnesium oxide interlayer and a 0.2 nm tantalum interlayer a TMR effect of 119% was achieved (with RA=4.5) and with a 0.3 nm magnesium oxide interlayer and a 0.2 nm tantalum interlayer a TMR effect of 116% was achieved (with RA=4.9). It can be deduced from this that an approximate improvement in the TMR effect of 15% is achievable with an interlayer having a combination of a magnesium oxide layer and a tantalum layer. To that end, as is shown in FIG. 5c, the thickness of the magnesium oxide layer and of the tantalum layer was varied. The results of this variation are shown in FIG. 5d. FIG. 5d shows a schematic diagram showing a TMR effect for various thicknesses of an MgO/Ta interlayer. In this case, the thickness of the tantalum interlayer (in A) is plotted on the x-axis and the TMR effect (in %) is plotted on the y-axis. Four different thicknesses of magnesium oxide interlayers were investigated, 0.35 nm (graph 550), 0.25 nm (graph 560), 0.15 nm (graph 570) and 0.05 nm (graph 580). For comparison purposes, the results from a layer stack without a magnesium oxide interlayer were plotted as graph 540. This graph reveals that the TMR effect without magnesium oxide remains below 100%, irrespective of the thickness of the tantalum interlayer. In the case of the layer stacks having magnesium oxide interlayers, the TMR effect increases linearly with the thickness of the tantalum layer. In this case, a thickness of 0.1 nm for the magnesium oxide interlayer and of 0.2 nm for the tantalum interlayer has proved to be a combination which exhibits a good combination of a maximum TMR effect and a small angle error.

More details and aspects of the magnetoresistive sensor and/or of the layer stack are mentioned in connection with the concept or examples described above (e.g. FIGS. 1a to 4b). The magnetoresistive sensor and/or the layer stack can comprise one or more additional optional features corresponding to one or more aspects of the proposed concept or of the described examples, as have been described above or below.

Figure 6A:
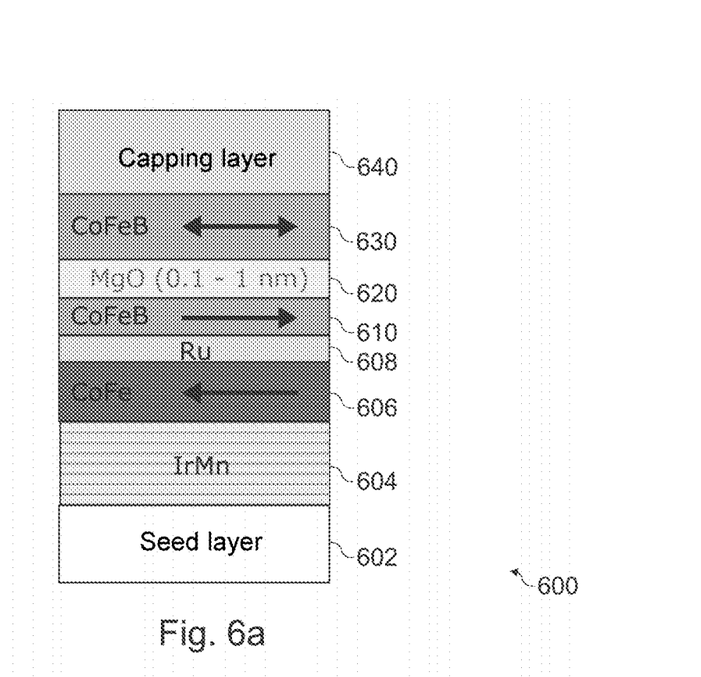
FIG. 6a shows a schematic diagram of an example of a layer stack for a magnetoresistive sensor.
Figure 6B:
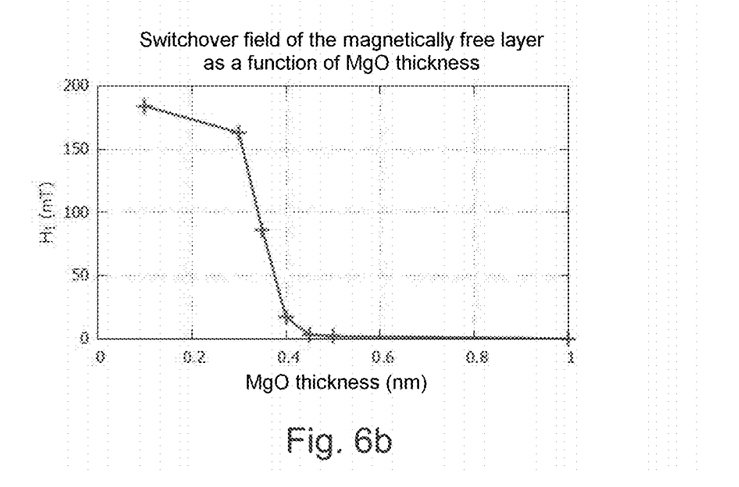
FIG. 6b shows a schematic diagram of a switchover field of a magnetically free layer as a function of a thickness of a magnesium oxide interlayer.

A further experiment determined to what extent the interlayer exchange coupling by way of magnesium oxide has an effect. Kerr measurements were carried out in order to determine how strongly the magnetically free layer (FL 630) is coupled to the reference layer. FIG. 6a shows a schematic diagram of an example of a layer stack for a magnetoresistive sensor. The layer stack comprises a seed layer system 602 having a plurality of layers (silicon oxide (SiOx) |tantalum (Ta, 5 nm), copper nitride (CuN, 20 nm), tantalum (Ta, 5 nm) ruthenium (Ru, 5 nm) and tantalum (Ta, 5 nm)). The layer stack furthermore comprises an antiferromagnetic (AFM) layer 604 composed of iridium-manganese (IrMn, 10 nm), a pinning layer (PL) 606 composed of a cobalt-iron alloy ($Co_{70}Fe_{30}$, 1.8 nm), a Ruderman-Kittel-Kasuya-Yosida (RKKY) coupling layer 608 composed of ruthenium (Ru, 0.725 nm), a reference layer (RL) 610 composed of cobalt-iron-boron ($Co_{60}Fe_{20}B_{20}$, 1.4 nm), a barrier layer (Barr) 620 composed of magnesium oxide (MgO, 0.1 to 1 nm), a magnetically free layer (FL) 630 composed of cobalt-iron-boron ($Co_{60}Fe_{20}B_{20}$, 2 nm), and a ruthenium layer 640 (Ru, 3 nm). FIG. 6b shows a schematic diagram of a switchover field of a magnetically free layer as a function of an MgO thickness, for the layer stack from FIG. 6a. In this case, the thickness of the MgO barrier layer (in nm) is plotted on the x-axis, and H1 (in mT) is plotted on the y-axis. It can be seen here that the coupling is observable for thicknesses of the MgO layer of less than 0.4 nm.

More details and aspects of the magnetoresistive sensor and/or of the layer stack are mentioned in connection with the concept or examples described above (e.g. FIGS. 1a to 5d). The magnetoresistive sensor and/or the layer stack can comprise one or more additional optional features corresponding to one or more aspects of the proposed concept or of the described examples, as have been described above or below.

Figure 7:
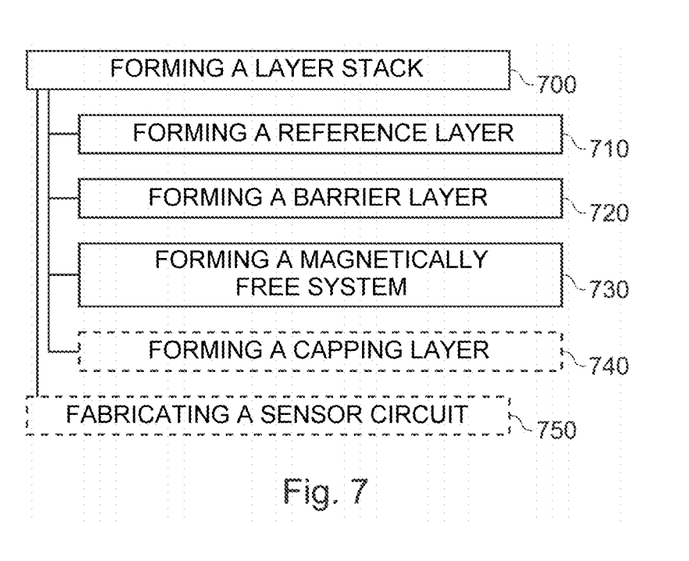
FIG. 7 shows a flow diagram of an exemplary embodiment of a fabrication method for a magnetoresistive sensor having a layer stack.

FIG. 7 shows a flow diagram of an exemplary embodiment of a fabrication method for a magnetoresistive sensor having a layer stack. By way of example, the fabrication method can be used to fabricate one of the layer stacks 100a; 100b; 100c; 100d; 200a; 200b; 300b; 500b; 500c from FIGS.

1a to 5c. The fabrication method comprises fabricating 700 a layer stack of the magnetoresistive sensor. Fabricating the layer stack comprises forming 710 a reference layer 10 having a fixed reference magnetization, wherein the reference magnetization has a first magnetic orientation. Fabricating the layer stack comprises forming 730 a magnetically free system 30 of a plurality of layers. The magnetically free magnetization is variable in the presence of an external magnetic field. The magnetically free magnetization has a second magnetic orientation in a ground state. The magnetically free system has two ferromagnetic layers 32; 38 and an interlayer 34; 36. The interlayer is arranged between the two ferromagnetic layers and comprises magnesium oxide. Fabricating the layer stack comprises forming 720 a barrier layer 20, which is arranged between the reference layer and the magnetically free system and comprises magnesium oxide. In some exemplary embodiments, the fabrication method can furthermore comprise forming 740 a capping layer and/or fabricating 750 the sensor circuit 50.

In at least some exemplary embodiments, fabricating the layer stack can comprise forming one or more further layers, for instance a seed layer, a pinning layer, a reference layer, a barrier layer, layers of the magnetically free system, and/or a capping layer. In this case, the layer stack can be formed for example on a substrate, for instance on an Si substrate or an SiO$_2$ substrate. In this case, the order can depend on the order of the layers in the layer stack. In this regard, by way of example, it is possible firstly to form the seed layer on the substrate and gradually to build up the adjacent layers on the seed layer. In this case, the individual layers can be formed by deposition.

More details and aspects of the fabrication method, of the magnetoresistive sensor and/or of the layer stack are mentioned in connection with the concept or examples described above (e.g. FIGS. 1a to 6b). The method, the magnetoresistive sensor and/or the layer stack can comprise one or more additional optional features corresponding to one or more aspects of the proposed concept or of the described examples, as have been described above or below.

The aspects and features that have been described together with one or more of the examples and figures described in detail above can also be combined with one or more of the other examples in order to replace an identical feature of the other example or in order additionally to introduce the feature into the other example.

The description and drawings present only the principles of the disclosure. Furthermore, all examples mentioned here are intended to be used expressly only for illustrative purposes, in principle, in order to assist the reader in understanding the principles of the disclosure and the concepts contributed by the inventor(s) for further development of the art. All statements herein regarding principles, aspects and examples of the disclosure and also concrete examples thereof encompass the counterparts thereof.

Functions of various elements shown in the figures, including of any function blocks referred to as "means", "means for providing a signal", "means for generating a signal", etc., can be implemented in the form of dedicated hardware, e.g. "a signal provider", "a signal processing unit", "a processor", "a controller", etc., and as hardware capable of executing software in conjunction with associated software. When provided by a processor, the functions can be provided by a single dedicated processor, by a single jointly used processor or by a plurality of individual processors, some or all of which can be used jointly. However, the term "processor" or "controller" is on no account limited to hardware exclusively capable of executing software, but rather can encompass digital signal processor hardware (DSP hardware), network processor, application specific integrate circuit (ASIC), field programmable gate array (FPGA), read only memory (ROM) for storing software, random access memory (RAM) and nonvolatile storage device. Other hardware, conventional and/or customized, can also be included.

A block diagram can represent a rough circuit diagram, for example, which implements the principles of the disclosure. In a similar manner, a flow diagram, a flow chart, a state transition diagram, a pseudo-code and the like can represent various processes, operations or steps which for example are substantially represented in a computer-readable medium and thus executed by a computer or processor, regardless of whether such a computer or processor is explicitly shown. Methods disclosed in the description or in the patent claims can be implemented by a component which has a means for carrying out each of the respective steps of these methods.

It goes without saying that the disclosure of a plurality of steps, processes, operations or functions disclosed in the description or in the claims should not be interpreted as being in the specific order, unless this is explicitly or implicitly indicated otherwise, for example for technical reasons. The disclosure of a plurality of steps or functions therefore does not limit them to a specific order unless said steps or functions are not interchangeable for technical reasons. Furthermore, in some examples, an individual step, function, process or operation can include a plurality of partial steps, functions, processes or operations and/or be subdivided into them. Such partial steps can be included and be part of the disclosure of said individual step, provided that they are not explicitly excluded.

Furthermore, the claims that follow are hereby incorporated in the detailed description, where each claim can be representative of a separate example by itself. While each claim can be representative of a separate example by itself, it should be taken into consideration that—although a dependent claim can refer in the claims to a specific combination with one or more other claims—other examples can also encompass a combination of the dependent claim with the subject matter of any other dependent or independent claim. Such combinations are explicitly proposed here, provided that no indication is given that a specific combination is not intended. Furthermore, features of a claim are also intended to be included for any other independent claim, even if this claim is not made directly dependent on the independent claim.

What is claimed is:

1. A magnetoresistive sensor, comprising:
a layer stack comprising:
a reference layer having a fixed reference magnetization, wherein the fixed reference magnetization has a first magnetic orientation;
a magnetically free system of a plurality of layers, wherein the magnetically free system has a magnetically free magnetization, wherein the magnetically free magnetization is variable in a presence of an external magnetic field, and wherein the magnetically free magnetization has a second magnetic orientation in a ground state,
wherein the magnetically free system has two ferromagnetic layers and a magnesium oxide interlayer, wherein the two ferromagnetic layers include a first ferromagnetic layer and a second ferromagnetic layer, wherein the first ferromagnetic layer and the second ferromagnetic layer have parallel magnetic orientations corresponding to the second magnetic orientation, wherein the magnesium oxide interlayer is arranged between the two ferromagnetic layers, wherein the magnesium oxide interlayer comprises only magnesium oxide, wherein the magnesium oxide interlayer couples the two ferromagnetic layers together by an interlayer exchange coupling (IEC) effect such that the two ferromagnetic layers function as a single sensor layer with the parallel magnetic orientations corresponding to the second magnetic orientation, and wherein a thickness of the magnesium oxide interlayer is manufactured at a fixed dimension that is set between 0.05 nm and 0.4 nm; and a barrier layer that is arranged between the reference layer and the magnetically free system and comprises magnesium oxide.

2. The magnetoresistive sensor as claimed in claim 1, further comprising a tantalum interlayer arranged between the magnesium oxide interlayer and the second ferromagnetic layer.

3. The magnetoresistive sensor as claimed in claim 2, wherein the tantalum interlayer is further away from the barrier layer than the magnesium oxide interlayer.

4. The magnetoresistive sensor as claimed in claim 3, wherein the magnesium oxide interlayer is in direct contact with the first ferromagnetic layer, the tantalum interlayer is in direct contact with the second ferromagnetic layer, and the magnesium oxide interlayer is in direct contact with the tantalum interlayer.

5. The magnetoresistive sensor as claimed in claim 2, wherein the tantalum interlayer comprises only tantalum.

6. The magnetoresistive sensor as claimed in claim 2, wherein the tantalum interlayer has a thickness greater than 0.1 nm.

7. The magnetoresistive sensor as claimed in claim 2, wherein the tantalum interlayer has a thickness greater than 0.1 nm and at most 0.3 nm.

8. The magnetoresistive sensor as claimed in claim 2, wherein a combined thickness of the magnesium oxide interlayer and the tantalum interlayer has a thickness of at least 0.05 nm and at most 0.7 nm.

9. The magnetoresistive sensor as claimed in claim 8, wherein the first ferromagnetic layer has a thickness of at least 0.5 nm and the second ferromagnetic layer has a thickness of at least 0.2 nm.

10. The magnetoresistive sensor as claimed in claim 8, wherein a thickness of the tantalum interlayer is greater than 0.1 nm and at most 0.3 nm.

11. The magnetoresistive sensor as claimed in claim 1, wherein the magnesium oxide interlayer is in direct contact with the two ferromagnetic layers.

12. The magnetoresistive sensor as claimed in claim 1, wherein at least one of the two ferromagnetic layers is fabricated from a cobalt-iron-boron alloy.

13. The magnetoresistive sensor as claimed in claim 1, wherein the first ferromagnetic layer of the two ferromagnetic layers is further away from the barrier layer than the second ferromagnetic layer of the two ferromagnetic layers, wherein the first ferromagnetic layer is fabricated from a nickel-iron alloy.

14. The magnetoresistive sensor as claimed in claim 1, wherein the reference layer comprises a cobalt-iron-boron alloy.

15. The magnetoresistive sensor as claimed in claim 1, wherein the layer stack further comprises a capping layer, wherein the capping layer comprises magnesium oxide and is arranged adjacent to the magnetically free system.

16. The magnetoresistive sensor as claimed in claim 1, wherein the first magnetic orientation and the second magnetic orientation are oriented in-plane.

17. The magnetoresistive sensor as claimed in claim 1, wherein the first magnetic orientation is oriented in-plane and the second magnetic orientation is oriented out-of-plane.

18. The magnetoresistive sensor as claimed in claim 1, further comprising:

a sensor circuit comprising one or more sensor elements, wherein the one or more sensor elements are configured to detect one or more direction components of the external magnetic field across the layer stack in order to generate one or more voltages corresponding to the one or more direction components of the external magnetic field.

19. A fabrication method for a magnetoresistive sensor, the fabrication method comprising:

fabricating a layer stack of the magnetoresistive sensor, including:
forming a reference layer having a fixed reference magnetization, wherein the fixed reference magnetization has a first magnetic orientation;
forming a magnetically free system of a plurality of layers, wherein the magnetically free magnetization is variable in a presence of an external magnetic field, and wherein the magnetically free magnetization has a second magnetic orientation in a ground state,
wherein the magnetically free system has two ferromagnetic layers and a magnesium oxide interlayer, wherein the two ferromagnetic layers include a first ferromagnetic layer and a second ferromagnetic layer, wherein the first ferromagnetic layer and the second ferromagnetic layer have parallel magnetic orientations corresponding to the second magnetic orientation, wherein the magnesium oxide interlayer is arranged between the two ferromagnetic layers and comprises only magnesium oxide, wherein the magnesium oxide interlayer couples the two ferromagnetic layers together by an interlayer exchange coupling (IEC) effect such that the two ferromagnetic layers function as a single sensor layer with the parallel magnetic orientations corresponding to the second magnetic orientation, and wherein a thickness of the magnesium oxide interlayer is manufactured at a fixed dimension that is set between 0.05 nm and 0.4 nm; and
forming a barrier layer that is arranged between the reference layer and the magnetically free system and comprises magnesium oxide.

20. The fabrication method of claim 19, wherein the magnetically free system has a tantalum interlayer arranged between the two ferromagnetic layers and in direct contact with the magnesium oxide interlayer, and wherein the tantalum interlayer has a thickness greater than 0.1 nm and at most 0.3 nm.

* * * * *